US012575289B2

(12) United States Patent
Ren

(10) Patent No.: US 12,575,289 B2
(45) Date of Patent: Mar. 10, 2026

(54) DISPLAY PANEL AND ELECTRONIC DEVICE WITH GREEN PHOTORESIST MADE OF DIFFERENT TYPES OF PIGMENTS

(71) Applicant: WUHAN CHINA STAR OPTOELECTRONICS SEMICONDUCTOR DISPLAY TECHNOLOGY CO., LTD., Wuhan (CN)

(72) Inventor: Yingying Ren, Wuhan (CN)

( * ) Notice: Subject to any disclaimer, the term of this patent is extended or adjusted under 35 U.S.C. 154(b) by 1107 days.

(21) Appl. No.: 17/623,297

(22) PCT Filed: Dec. 21, 2021

(86) PCT No.: PCT/CN2021/140058
§ 371 (c)(1),
(2) Date: Jun. 22, 2023

(87) PCT Pub. No.: WO2023/108717
PCT Pub. Date: Jun. 22, 2023

(65) Prior Publication Data

US 2024/0057433 A1 Feb. 15, 2024

(30) Foreign Application Priority Data

Dec. 15, 2021 (CN) ........................ 202111534680.1

(51) Int. Cl.
*H10K 59/38* (2023.01)
*C08K 5/00* (2006.01)
(Continued)

(52) U.S. Cl.
CPC .......... *H10K 59/38* (2023.02); *C08K 5/0091* (2013.01); *C08K 5/3417* (2013.01);
(Continued)

(58) Field of Classification Search
CPC .... H10K 59/38; H10K 85/141; H10K 85/331; H10K 85/371; H10K 85/636;
(Continued)

(56) References Cited

U.S. PATENT DOCUMENTS 4,680,387 A * 7/1987 Kranz ................ C09B 67/0019 540/137
2011/0304804 A1 12/2011 Lee et al.
2018/0094141 A1 4/2018 Kwon et al.

FOREIGN PATENT DOCUMENTS

CN 1309319 A 8/2001
CN 106707594 A 5/2017
(Continued)

OTHER PUBLICATIONS

Machine Translation, CN 1309319 A, Takizawa et al., Aug. 22, 2001 (Year: 2001).*

*Primary Examiner* — Scott B Geyer

(57) ABSTRACT

A display panel and an electronic device are provided. The electronic device includes the display panel, the display panel includes a color filter layer, and the color filter layer includes a green photoresist. By adding a pigment A shown in a structural formula (I) to a color material of the green photoresist, the influence of illumination on the green photoresist can be reduced, and therefore, the transmittance of the green photoresist is improved.

18 Claims, 2 Drawing Sheets

(51) Int. Cl.

| | |
|---|---|
| ***C08K 5/3417*** | (2006.01) |
| ***C08K 5/3462*** | (2006.01) |
| ***C09K 11/02*** | (2006.01) |
| ***C09K 11/06*** | (2006.01) |
| ***G02B 1/04*** | (2006.01) |
| ***H10K 85/10*** | (2023.01) |
| ***H10K 85/30*** | (2023.01) |
| ***H10K 85/60*** | (2023.01) |

(52) U.S. Cl.

CPC ............ *C08K 5/3462* (2013.01); *C09K 11/02* (2013.01); *C09K 11/06* (2013.01); *G02B 1/04* (2013.01); *H10K 85/141* (2023.02); *H10K 85/331* (2023.02); *H10K 85/371* (2023.02); *H10K 85/636* (2023.02); *H10K 85/654* (2023.02); *H10K 85/6572* (2023.02); *C09K 2211/1022* (2013.01); *C09K 2211/1029* (2013.01); *C09K 2211/1044* (2013.01); *C09K 2211/187* (2013.01); *C09K 2211/188* (2013.01)

(58) Field of Classification Search

CPC .. H10K 85/654; H10K 85/6572; H10K 59/00; C08K 5/0091; C08K 5/3417; C08K 5/3462; C09K 11/02; C09K 11/06; C09K 2211/1022; C09K 2211/1029; C09K 2211/1044; C09K 2211/187; C09K 2211/188; G02B 1/04; G02F 1/133514; C08F 265/00

See application file for complete search history.

(56) References Cited

FOREIGN PATENT DOCUMENTS

| | | | |
|---|---|---|---|
| CN | 109722061 | A | 5/2019 |
| JP | 2004176000 | A | 6/2004 |
| JP | 2011242568 | A | 12/2011 |
| JP | 4993026 | B1 | 8/2012 |
| JP | 2012247539 | A | 12/2012 |
| JP | 2018180445 | A | 11/2018 |
| JP | 2019112537 | A | 7/2019 |

* cited by examiner

DISPLAY PANEL AND ELECTRONIC DEVICE WITH GREEN PHOTORESIST MADE OF DIFFERENT TYPES OF PIGMENTS

The present invention relates to the technical field of display, in particular to a display panel and an electronic device.

BACKGROUND OF INVENTION

Display panels of electronic devices mainly include a liquid crystal display (LED) panel, a plasma display panel (PDP), an organic light emitting diode (OLED) display panel, an active-matrix organic light emitting diode (AMOLED) display panel, and other types, which have a wide application space in products such as a vehicle-mounted product, a mobile phone, a tablet computer, a computer and a television.

Currently, a polarizer-less (POL-Less) technology has been realized in folding mobile phones. The technology has the advantages of thin thickness, which facilitates development of dynamic bending display products, and high light extraction efficiency, which facilitates extension of life of organic light emitting diodes. In order to develop alternative polarizer technology, a new low-temperature color filter material came into being. A color filter layer consists of red, green, blue and black matrixes. In the OLED display panel, an R/G/B photoresist is responsible for light extraction of a corresponding R/G/B sub-pixel unit, and the black matrix is mainly responsible for preventing light leakage of the panel and reducing reflection of the panel. A technology of replacing a polarizer with the color filter layer is classified as a POL-Less technology.

SUMMARY OF INVENTION

Compared with the polarizer, currently the problem of the low-temperature color filter layer in an environmental reliability assessment process lies in the decrease of transmittance, the problem of green photoresists being particularly prominent, which has a great influence on the yield of organic light emitting diode display panels.

In conclusion, the problem of a display panel adopting a polarizer-less technology is that the transmittance of green photoresists is decreased, Therefore, a display panel and an electronic device need to be provided to overcome the defect.

Embodiments of the present application provide a display panel and an electronic device which are configured to solve the problem of an existing display panel adopting a polarizer-less technology that the transmittance of green photoresists is decreased.

An embodiment of the present application provides a display panel, including:

a light emitting component layer, including a plurality of light emitting units; and a color filter layer, arranged on a light extraction side of the light emitting component layer, including green photoresists arranged in alignment with the light emitting units, and a material of the green photoresists including a color material.

The color material includes pigment A shown in a structural formula (I):

(I)

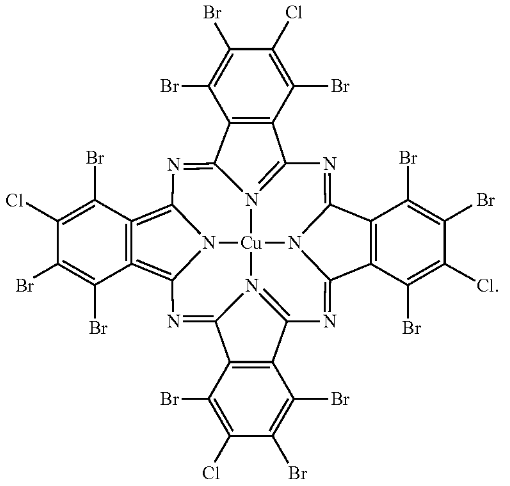

According to one embodiment of the present application, the color material further includes pigment B shown in a structural formula (II) and pigment C shown in a structural formula (III):

(II)

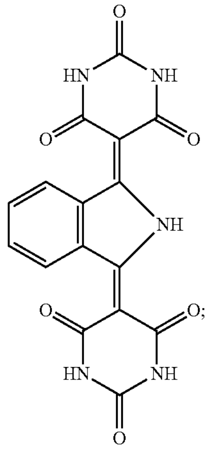

and (III)

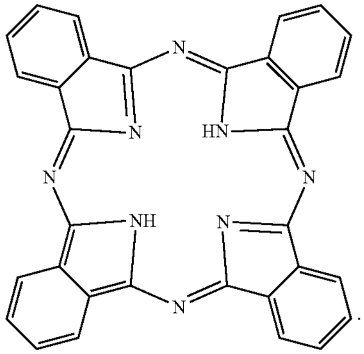

According to one embodiment of the present application, by mass fraction, the color material includes:

5-20% of the pigment A by mass fraction;

10-35% of the pigment B by mass fraction; and 20-65% of the pigment C by mass fraction.

According to one embodiment of the present application, the color material further includes pigment D shown in a structural formula (IV):

(IV)

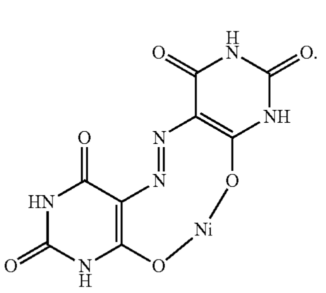

According to one embodiment of the present application, a mass fraction of the pigment D is greater than a mass fraction of the pigment B in the color material.

According to one embodiment of the present application, by mass fraction, the color material includes:

15-25% of the pigment A by mass fraction;

0-10% of the pigment B by mass fraction;

15-40% of the pigment C by mass fraction; and 20-50% of the pigment D by mass fraction.

According to one embodiment of the present application, the mass fraction of the pigment D is greater than a mass fraction of the pigment A and a mass fraction of the pigment C.

According to one embodiment of the present application, by mass fraction, the green photoresist includes 0-30% of the color material by mass fraction.

According to one embodiment of the present application, the green photoresist further includes a solvent, and a material of the solvent includes at least one of propylene glycol methyl ether acetate, propylene glycol monomethyl ether, or diacetone alcohol.

According to one embodiment of the present application, the green photoresist further includes a reactive monomer, and a material of the reactive monomer includes at least one of methyl methacrylate, acrylic acid, methacrylic acid or glycidyl methacrylate.

An embodiment of the present application provides an electronic device, including a display panel. The display panel includes:

- a light emitting component layer, including a plurality of light emitting units; and
- a color filter layer, arranged on a light extraction side of the light emitting component layer, including green photoresists arranged in alignment with the light emitting units, and a material of the green photoresists including a color material.

The color material includes pigment A shown in a structural formula (I):

(I)

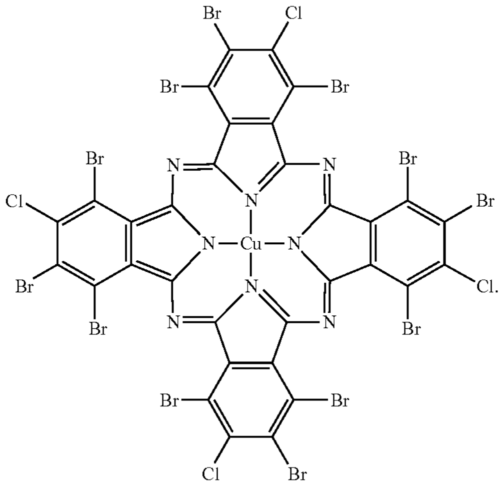

According to one embodiment of the present application, the color material further includes pigment B shown in a structural formula (II) and pigment C shown in a structural formula (III):

(II)

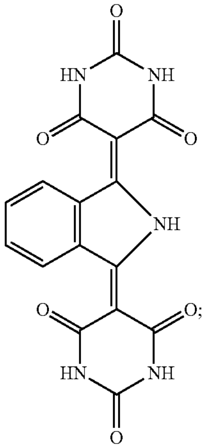

and (III)

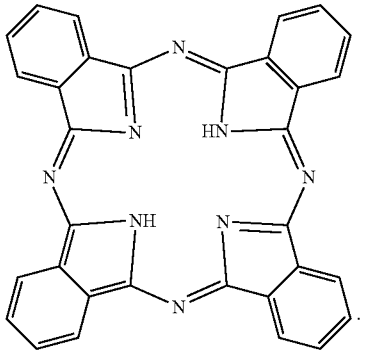

According to one embodiment of the present application, by mass fraction, the color material includes:

5-20% of the pigment A by mass fraction;

10-35% of the pigment B by mass fraction; and 20-65% of the pigment C by mass fraction.

According to one embodiment of the present application, the color material further includes pigment D shown in a structural formula (IV):

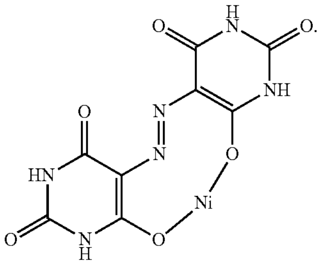

(IV)

According to one embodiment of the present application, a mass fraction of the pigment D is greater than a mass fraction of the pigment B in the color material.

According to one embodiment of the present application, by mass fraction, the color material includes:

15-25% of the pigment A by mass fraction;

0-10% of the pigment B by mass fraction;

15-40% of the pigment C by mass fraction; and 20-50% of the pigment D by mass fraction.

According to one embodiment of the present application, the mass fraction of the pigment D is greater than a mass fraction of the pigment A and a mass fraction of the pigment C.

According to one embodiment of the present application, by mass fraction, the green photoresist includes 0-30% of the color material by mass fraction.

According to one embodiment of the present application, the green photoresist further includes a solvent, and a material of the solvent includes at least one of propylene glycol methyl ether acetate, propylene glycol monomethyl ether, or diacetone alcohol.

According to one embodiment of the present application, the green photoresist further includes a reactive monomer, and a material of the reactive monomer includes at least one of methyl methacrylate, acrylic acid, methacrylic acid or glycidyl methacrylate.

The embodiments of the present disclosure have the beneficial effects that: embodiments of the present application provide a display panel and an electronic device. The electronic device includes the display panel, the display panel includes a light emitting component layer and a color filter layer, the color filter layer is arranged on a light extraction side of the light emitting component layer, the color filter layer includes a green photoresist arranged in alignment with the light emitting unit, the green photoresist includes a color material. By adding the pigment A shown in a structural formula (I) to the color material of the green photoresist, the influence of illumination on the green photoresist can be reduced, and therefore, the transmittance of the green photoresist is improved.

BRIEF DESCRIPTION OF DRAWINGS

To describe the technical solutions of the embodiments or the existing technology more clearly, the following briefly introduces the accompanying drawings required for describing the embodiments or the existing technology. Apparently, the accompanying drawings in the following description show only some embodiments, and a person of ordinary skill in the art may still derive other drawings from these accompanying drawings without creative efforts.

DETAILED DESCRIPTION OF PREFERRED EMBODIMENTS

The following description of various embodiments is provided to exemplify the specific embodiments of the present application with reference to accompanying drawings. The directional terms mentioned in the present application, for example, "upper", "lower", "before", "after", "left", "right", "inside", "outside", and "side", merely refer to directions in the accompanying drawings. Therefore, the used direction terms are intended to describe and understand the present application, but are not intended to limit the present application, in the figures, units with similar structures are represented by using the same reference number.

The present application will be further described below with reference to the accompanying drawings and specific embodiments.

At present, the problem of a low-temperature color filter layer in an environmental reliability assessment process lies in the decrease of transmittance. The problem of green photoresists is particularly prominent. It is specifically embodied that a green color filter simulates a display panel laminated structure and is bonded to an optical clear adhesive (OCA) and cover glass (CG), and after a long time test under a sunlight environment, a dark rectangular frame appears in an appearance of the green color filter, thus resulting in a serious decrease in transmittance. The phenomenon is also proved in a display panel, which has great influence on the yield of organic light emitting diode display panels.

A process of a sunlight illumination experiment is designed that, a full-film color filter coated with only a green photoresist is bonded to CG through OCA; the full-film color filter is divided into two regions, and one of the regions is shaded by copper foil while the other region is not shaded; and a light fastness experiment is carried out and chrominance before and after illumination is measured.

A test result shows that, under an environment with illumination and at a certain temperature, no dark rectangular frame appears in a full-film color filter laminated structure in the region shaded by the copper foil, a dark rectangular frame appears in a full-film color filter laminated structure in the region with illumination, and the dark rectangular frame has influence on the transmittance and color cast of the full-film color filter laminated structure. As the full-film color filter laminated structure is placed for a long time under a room temperature environment, the dark rectangular frame gradually becomes smaller until it disappears, and the transmittance and color cast of the full-film color filter laminated structure return to normal.

| No. | | Type | ΔE*ab(Spec ≤3) |
|---|---|---|---|
| Light fastness test | G-1 | Unshaded | 14.61 |
| | | Shaded | 0.65 |
| | G-2 | Unshaded | 14.54 |
| | | Shaded | 0.65 |

-continued

| No. | | Type | ΔE*ab(Spec ≤3) |
|---|---|---|---|
| | G-3 | Unshaded | 17.01 |
| | | Shaded | 1.39 |

Table 1: Sunlight Illumination and Shading Test Result

Figure 1:
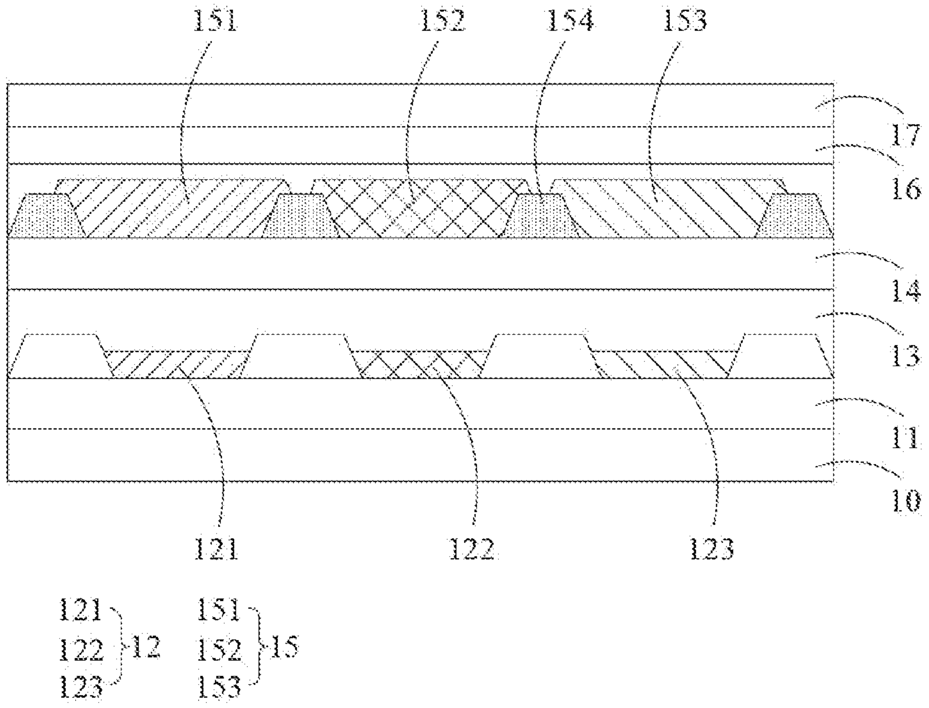
FIG. 1 is a schematic structural diagram of a display panel provided by an embodiment of the present application.

As shown in Table 1, three groups of experiments are established according to a flow shown in FIG. 1, namely G-1, G-2 and G-3. In the three groups of experiments, molecular compositions of pigment of color materials in the green photoresist are identical, which all adopt a pigment G shown in a formula (V):

(V)

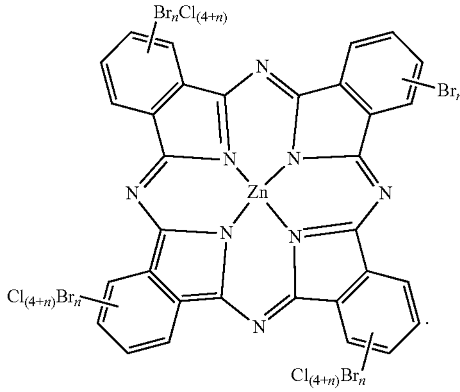

A difference among the above groups lies in that, compared with G-1, a monomer is adjusted in G-2, and a proportion of pigment compositions in the color material is adjusted in G-3. The experimental test found that there is still a big difference in color difference (ΔE*ab) between the shaded region and the unshaded region in the three groups of experiments, that is, the results of the above three groups of experiments still cannot meet the specification requirements. In addition, there are also changes to the experimental designs. That is, a dispersant, dispersion resin or other materials in the green photoresist are replaced, the full-film color filter is additionally exposed at 100 mJ or is subjected to hard baking (230° C./20 min) before being bonded to the OCA, the full-film color filter is additionally coated with a flat layer after a low-temperature manufacture procedure, and the like, but the problem of light fastness cannot be thoroughly solved. II is speculated that the problem is related to composition of pigment molecules.

It is speculated that one reason for abnormality mechanism of the full-film color filter laminated structure is that: when stimulated by light, color (pigment blue) in the green photoresist is stimulated from a base state to an excited state, the excited state is transited to a triplet state through an internal conversion process in a radiation-free mode, and in the triplet state, the color receives electrons from an electron-rich donor to form free radicals, which results in the decrease of transmittance. In the sunlight illumination test, oxygen is isolated by the OCG and the CG in the laminated structure, so the life of the free radicals is extended; and the transmittance is decreased, and the dark rectangular frame appears. The monomer is in contact with oxygen, which has an inhibiting effect on the free radicals is achieved, so the monomer has no abnormality.

It is speculated that a second reason for abnormality mechanism of the full-film color filter laminated structure is that: in the pigment G in the photoresist, central metal ions Zn produce water coordination under the effect of light, heat and water, and the absorption of light by the coordinated pigment G changes, which results in spectrum changes of a G photoresist material.

Based on the above experiments and the speculations on the abnormality mechanism of the full-film color filter laminated structure, embodiments of the present application provide a display panel and an electronic device, which are configured to improve light fastness of green photoresists in the display panel so as to reduce the influence of illumination on the transmittance of the green photoresists, thereby improving the yield and reliability of the display panel and the electronic device.

The electronic device includes the display panel, a shell configured to support the display panel, and components such as a processor and a power supply which are arranged in the shell and are configured to drive the display panel to realize an image display function. The electronic device may be a mobile terminal, such as a smart phone, a tablet computer, and a notebook computer; the electronic device may also be a wearable terminal, such as a smart watch, a smart bracelet, smart glasses, and an augmented reality device; and the electronic device may further be a fixed terminal, such as a desktop computer and a television.

As shown in FIG. 1, FIG. 1 is a schematic structural diagram of a display panel provided by an embodiment of the present application. The display panel includes a thin film transistor array layer 11, a light emitting component layer 12, an encapsulation layer 13, a touch control layer 14, a color filter layer 15, an optical clear adhesive (OCA) 16, and a protective layer 17, which are sequentially stacked on a base substrate 10. The protective layer 17 may be glass or other transparent hard or soft materials.

The light emitting component layer 12 includes a plurality of light emitting units distributed in an array mode, and each light emitting unit is an independent sub-pixel with a light emitting function. The light emitting units may include but are not limited to red light-emitting units 121, green light-emitting units 122, and blue light-emitting units 123, The red light-emitting units 121, the green light-emitting units 122, and the blue light-emitting units 123 may be arranged according to an arrangement mode of light-emitting units in the prior art.

Each of the light emitting units may include a light emitting element matched with it in color. In the embodiment of the present application, the light emitting element may be an organic light emitting diode (OLED). In practical application, the type of the light emitting element is not limited to the OLED in the above embodiment; and the light emitting element may also be a micro light emitting diode (micro LED) or a mini light emitting diode (mini LED).

The color filter layer 15 is arranged on a light extraction side of the light emitting component layer 12. The color filter layer 15 includes a plurality of photoresists arranged in alignment with the light emitting units. An orthographic projection of the photoresist on the base substrate 10 can completely cover an orthographic projection of the light emitting unit on the base substrate 10.

The photoresists include a red photoresist 151, a green photoresist 152 and a blue photoresist 153. The red photoresist 151 is arranged in alignment with the red light emitting unit 121, the green photoresist 152 is arranged in alignment with the green light emitting unit 122, and the blue photoresist 153 is arranged in alignment with the blue light emitting unit 123.

The color filter layer 15 further includes a plurality of black matrixes 154. The black matrixes are arranged between adjacent photoresists. An orthographic projection of the black matrix on the base substrate 10 can cover a metal trace in the touch control layer 14.

Further, a material of the green photoresist 152 includes a color material and a transparent material. The color material consists of a mixture of different types of pigments and is mainly configured to display colors. The transparent material mainly includes a polymer, a monomer, a photosensitizer, a solvent and an additive.

The polymer includes a dispersant and resin. The dispersant is mainly configured to stabilize the color material in the photoresist. The dispersant may be acrylic system resin. The acrylic system resin contains carboxyl groups and has alkali solubility, and the acrylic system resin may specifically be acrylic resin. In practical application, the dispersant may further include but is not limited to polyimide.

The monomer may be an acrylic system monomer, and the monomer may react with free radicals in the resin to open a double bond to cause a polymerization reaction. Specifically, a material of the monomer includes at least one of methyl methacrylate, acrylic acid, methacrylic acid or glycidyl methacrylate.

The solvent may be a high boiling point solvent, which can dissolve ingredients other than the color material in the green photoresist, so as to ensure the coating uniformity of the green photoresist. Specifically, a material of the solvent includes at least one of propylene glycol methyl ether acetate, propylene glycol monomethyl ether, or diacetone alcohol.

The photosensitizer may be a free radical initiator, and the photosensitizer can generate free radicals after being irradiated by ultraviolet rays and initiate monomer polymerization.

The additive may be a surface smoothing agent, and the surface smoothing agent can further improve the coating uniformity of the green photoresist.

Further, the color material includes a pigment A shown in a structural formula (I):

(I)

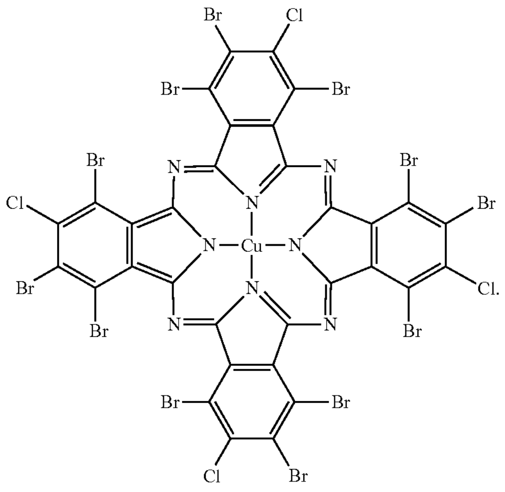

In a first embodiment of the present application, the color material further includes a pigment B shown in a structural formula (II) and a pigment C shown in a structural formula (III):

(II)

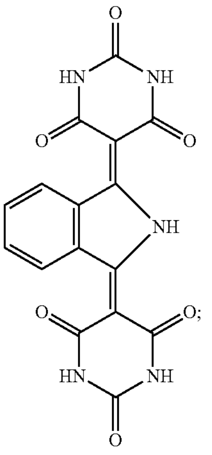

and (III)

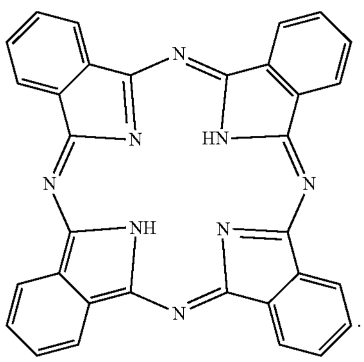

Further, by mass fraction, the color material includes 5-20% of the pigment A by mass fraction, 10-35% of the pigment B by mass fraction, and 20-65% of the pigment C by mass fraction.

In the first embodiment of the present application, the dosage of all ingredients in the color material is:

by mass fraction, a mass fraction of the pigment A is 15%, a mass fraction of the pigment B is 27%, and a mass fraction of the pigment C is 58%.

In a second embodiment of the present application, ingredients in the color material are the same as the ingredients in the color material in the first embodiment, but the dosage of the ingredients is different from that in the first embodiment. The dosage of all ingredients in the color material is:

by mass fraction, a mass fraction of the pigment A is 10%, a mass fraction of the pigment B is 35%, and a mass fraction of the pigment C is 55%.

In a third embodiment of the present application, ingredients in the color material are the same as the ingredients in the color material in the first embodiment, but the dosage of the ingredients is different from that in the first embodiment. The dosage of all ingredients in the color material is:

by mass fraction, a mass fraction of the pigment A is 5%, a mass fraction of the pigment B may be 10%, a mass fraction of the pigment C may be 65%, and other materials may be an initiator.

In a fourth embodiment of the present application, ingredients in the color material are the same as the ingredients in the color material in the first embodiment, but the dosage of the ingredients is different from that in the first embodiment. The dosage of all ingredients in the color material is:

by mass fraction, a mass fraction of the pigment A is 20%, a mass fraction of the pigment B may be 25%, a mass fraction of the pigment C may be 20%, and other materials may be an initiator.

In a fifth embodiment of the present application, the color material includes a pigment A shown in a structural formula (I), a pigment B shown in a structural formula (II), a pigment C shown in a structural formula (III), and a pigment D shown in a structural formula (IV):

(IV)

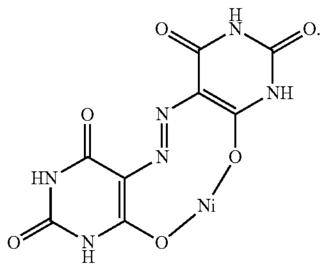

Further, by mass fraction, the color material includes 15-25% of the pigment A by mass fraction, 0-10% of the pigment B by mass fraction, 15-40% of the pigment C by mass fraction, and 20-50% of the pigment D by mass fraction.

In the fifth embodiment of the present application, the dosage of all ingredients in the color material is:

by mass fraction, a mass fraction of the pigment A is 20%, a mass fraction of the pigment B is 5%, a mass fraction of the pigment C is 35%, and a mass fraction of the pigment D is 40%.

In a sixth embodiment of the present application, ingredients in the color material are the same as the ingredients in the color material in the fifth embodiment, but the dosage of the ingredients is different from that in the fifth embodiment. The dosage of all ingredients in the color material is:

by mass fraction, a mass fraction of the pigment A is 25%, a mass fraction of the pigment B is 10%, a mass fraction of the pigment C is 40%, and a mass fraction of the pigment D is 25%.

In a seventh embodiment of the present application, ingredients in the color material are the same as the ingredients in the color material in the fifth embodiment, but the dosage of the ingredients is different from that in the fifth embodiment. The dosage of all ingredients in the color material is:

a mass fraction of the pigment A is 15%, a mass fraction of the pigment B is 1%, a mass fraction of the pigment C is 15%, a mass fraction of the pigment D is 50%, and other materials may be an initiator.

In an eighth embodiment of the present application, ingredients in the color material are the same as the ingredients in the color material in the fifth embodiment, but the dosage of the ingredients is different from that in the fifth embodiment. The dosage of all ingredients in the color material is:

a mass fraction of the pigment A is 23%, a mass fraction of the pigment B is 8%, a mass fraction of the pigment C is 20%, a mass fraction of the pigment D is 20%, and other materials may be an initiator.

In the sunlight illumination experiment in the embodiment of the present application, the green photoresists of different color material ingredients are made into full-film color filters, and a light fastness experiment is carried out after all the full-film color filters are bonded to the OCA and cover plates. Each full-film color filter is divided into two blocks, one half is shaded by copper foil and the other half is not shaded; and chrominance before and after illumination is measured, so as to test the test spectrums of the green photoresist consisting of the different color material ingredients as well as results of sunlight illumination.

| | No. | | |
|---|---|---|---|
| | G-4 | G-5 | G-6 |
| Color material composition | G/B/C | A/B/C | A/B/C/D |
| Initiator | b STD | — | — |
| | u STD | u 110% | u 90% |
| | w STD | — | — |
| Irradiation result | A dark rectangular frame appeared | A light-colored rectangular frame appeared | No rectangular frame appeared |

Figure 2:
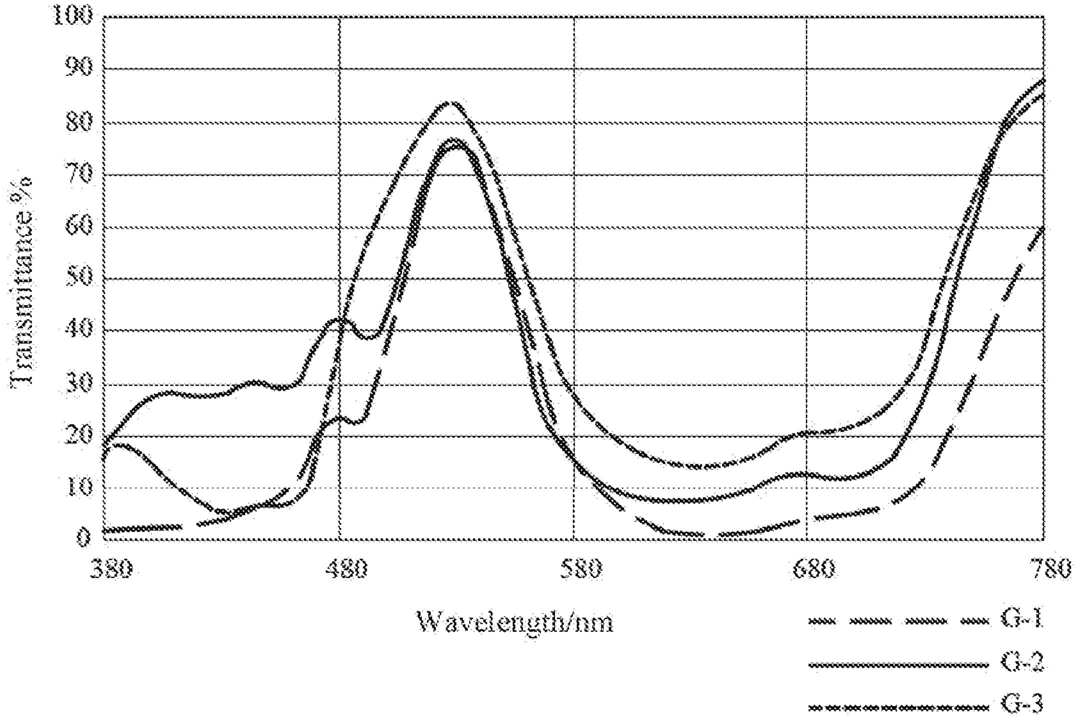
FIG. 2 is a schematic diagram of a transmission spectrum corresponding to G-4, G-5 and G-6 provided by an embodiment of the present application.

Table 2 Comparison of ingredient compositions of different green photoresists and illumination results As shown in FIG. 2, sunlight illumination experiments are established for the green photoresists of different color material ingredients. Specifically, G-4 is a control group, and the color material ingredients of the green photoresists of G-4 are pigment ingredients in color materials of existing green photoresists. The color material ingredients of the green photoresists of G-4 include the pigment G, the pigment B and the pigment C mentioned above.

Color material ingredients in an experimental group G-5 are the pigment ingredients of the color material in the above first embodiment, and a color material composition of green photoresists in G-5 includes the pigment A, the pigment B and the pigment C. In G-5, a mass fraction of the pigment A is 15%, a mass fraction of the pigment B is 27%, and a mass fraction of the pigment C is 58%.

Pigment ingredients of green photoresists in an experimental group G-6 are the pigment ingredients of the color material in the above fifth embodiment, and a color material composition of G-6 includes the pigment A, the pigment B, the pigment C and the pigment D. In G-6, a mass fraction of the pigment A is 20%, a mass fraction of the pigment B is 5%, a mass fraction of the pigment C is 35%, and a mass fraction of the pigment D is 40%.

Light sensitivity of the green photoresist is affected by added amount of an initiator. In the experiment, light sensitivity is classified into three levels, namely zero sensitivity b, high sensitivity u and super sensitivity w, and for added amount of initiators in G-5 and G6, added amount in G-4 is adopted as a reference value. In the experimental group G-5, no initiator is added for zero sensitivity b and high sensitivity u, and for super sensitivity w, 10% of initiator is added on the basis of the reference value STD in G-4. In the experimental group G-6, no initiator is added for zero sensitivity b and high sensitivity u, and for super sensitivity w, 10% of initiator is reduced on the basis of the reference value STD in G-4.

It can be seen from Table 2 that, a difference between G-4 and G-5 lies in that, a green pigment in G-4 adopts pigment green G and a green pigment in G-5 adopts the pigment A; and a difference between G-5 and G-6 lies in that, a yellow pigment in G-6 further includes the pigment D and a mass fraction of the pigment D is greater than a mass fraction of the pigment B.

As shown in FIG. 2, FIG. 2 is a schematic diagram of a transmission spectrum corresponding to G-4, G-5 and G-6 provided by the embodiment of the present application. It can be seen from corresponding curves of G-4 and G-5 that, compared with G-4, the transmittance of a green color filter of G-5 to light is obviously increased. An experiment result of G-4 shows that, after illumination of sunlight, a dark rectangular frame is formed on a green color filter, and an experiment result of G-5 shows that, after illumination of sunlight, a light-colored rectangular frame is formed on the green color filter.

It can thus be seen that, by replacing the pigment G in G-4 with the pigment A, the transmittance of the illuminated green color filter to light can be obviously increased. In this way, the problem that the transmittance of the green color filter is reduced after the green color filter is illuminated by sunlight can be improved to a certain extent, so the property of resistance of the color filter layer to sunlight can be improved, thereby improving the yield of OLED display panels adopting a polarizer-free technology.

It can be seen from corresponding curves of G-5 and G-6 that, compared with G-5, the transmittance of a green color filter of G-6 to shortwave (a wavelength less than 500 nm) light is reduced, while the transmittance to light with a wavelength greater than 500 nm is obviously increased. An experiment result of G-6 shows that, after illumination of sunlight, no rectangular frame appears on the green color filter, i.e. no abnormality exists after the green color filter is illuminated by sunlight. It can thus be seen that, by adding the pigment D to the color material of G-5, the transmittance of the green photoresist after being illuminated by sunlight can be further improved on the basis of G-5, and the property of resistance of the color filter layer to sunlight can be further improved.

Further, the mass fraction of the pigment D is greater than the mass fraction of the pigment B in the color material. It can be seen in combination with the experimental results in the above Table 2 that, because the pigment D has a darker color than that of the pigment B, and has a higher absorption rate to shortwave light (a wavelength less than 500 nm), by adding the pigment D in the OCA, the chroma of the green photoresist can be increased; and meanwhile, by increasing a proportion of the pigment D in the color material while lowering a proportion of the pigment B in the color material, the penetration of the shortwave light can be reduced while the penetration rate of light with a wavelength greater than 500 urn can be increased, thereby lowering the influence of light on the penetration rate of the green photoresist.

Further, a mass fraction of the color material in the green photoresist is greater than 0 and is less than or equal to 30%.

In the embodiment of the present application, the mass fraction of the color material in the green photoresist is about 20%. In this way, by lowering the proportion of the color material in the green photoresist, the chroma of the green photoresist is lowered, and at the same time, by increasing a proportion of the transparent material in the green photoresist, the color material can be protected, so changes caused by illumination are avoided. In practical application, the mass fraction of the color material in the green photoresist is not limited to 20% in the above embodiment, and may also be 1%, 5%, 10%, 15%, 25%, 30% or the like.

The embodiments of the present application provide the display panel and the electronic device, the electronic device includes the display panel, the display panel includes the light emitting component layer and the color filter layer, the light emitting component layer includes the plurality of light emitting units, the color filter layer is arranged on the light extraction side of the light emitting component layer, the color filter layer includes the green photoresist arranged in alignment with the light emitting unit, the green photoresists include the color material, and by adding the pigment A shown in the structural formula (I) to the color material, the influence of illumination on the green photoresist can be reduced, thereby improving the transmittance of the green photoresist.

In conclusion, although preferred embodiments of the present application are already disclosed above, the preferred embodiment are not intended to limit the present application. A person of ordinary skill in the art can make various modifications and embellishments without departing from the spirit and scope of the present application. Therefore, the protection scope of the present application is subject to the scope defined by the claims.

What is claimed is:

1. A display panel, comprising:

a light emitting component layer, comprising a plurality of light emitting units; and a color filter layer, arranged on a light extraction side of the light emitting component layer, comprising green photoresists arranged in alignment with the light emitting units, and a material of the green photoresists comprising a color material, wherein the color material comprises pigment A shown in a structural formula (I):

(I)

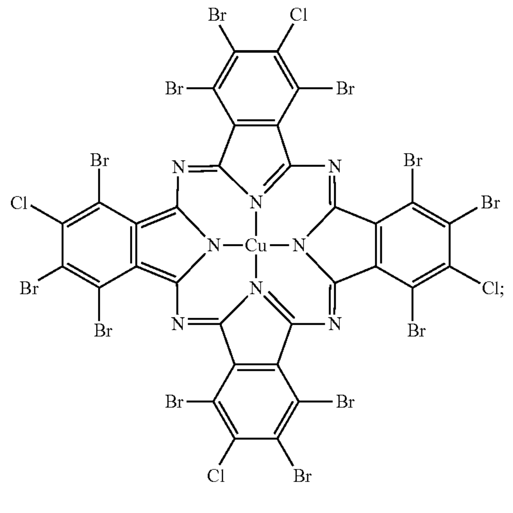

wherein the color material further comprises a pigment B shown in a structural formula (II) and a pigment C shown in a structural formula (III):

(II)

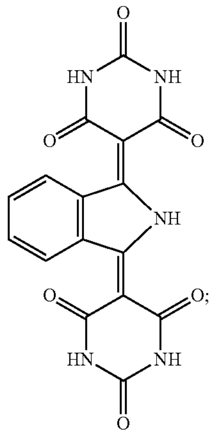

and (III)

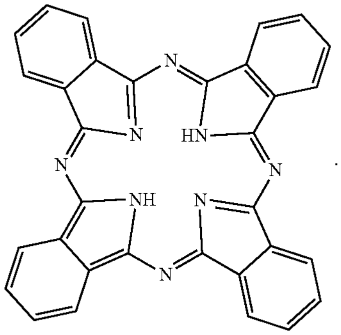

2. The display panel according to claim 1, wherein by mass fraction, the color material comprises:

5-20% of the pigment A by mass fraction;

10-35% of the pigment B by mass fraction; and 20-65% of the pigment C by mass fraction.

3. The display panel according to claim 1, wherein the color material further comprises a pigment D shown in a structural formula (IV):

(IV)

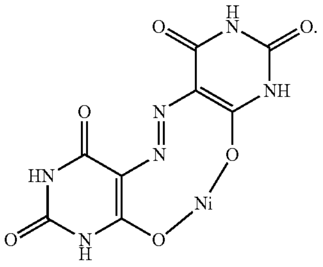

4. The display panel according to claim 3, wherein a mass fraction of the pigment D is greater than a mass fraction of the pigment B in the color material.

5. The display panel according to claim 4, wherein by mass fraction, the color material comprises:

15-25% of the pigment A by mass fraction;

0-10% of the pigment B by mass fraction;

15-40% of the pigment C by mass fraction; and 20-50% of the pigment D by mass fraction.

6. The display panel according to claim 5, wherein the mass fraction of the pigment D is greater than a mass fraction of the pigment A and a mass fraction of the pigment C.

7. The display panel according to claim 1, wherein by mass fraction, the green photoresist comprises 0-30% of the color material by mass fraction.

8. The display panel according to claim 1, wherein the green photoresist further comprises a solvent, and a material of the solvent comprises at least one of propylene glycol methyl ether acetate, propylene glycol monomethyl ether, or diacetone alcohol.

9. The display panel according to claim 1, wherein the green photoresist further comprises a reactive monomer, and a material of the reactive monomer comprises at least one of methyl methacrylate, acrylic acid, methacrylic acid or glycidyl methacrylate.

10. An electronic device, comprising a display panel, wherein the display panel comprises:

a light emitting component layer, comprising a plurality of light emitting units; and a color filter layer, arranged on a light extraction side of the light emitting component layer, comprising green photoresists arranged in alignment with the light emitting units, and a material of the green photoresists comprising a color material, wherein the color material comprises pigment A shown in a structural formula (I):

(I)

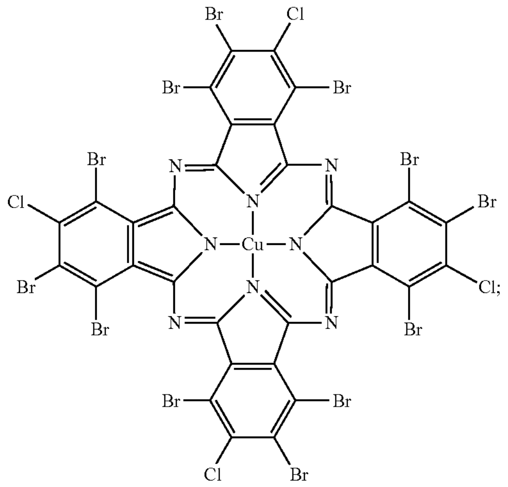

wherein the color material further comprises a pigment B shown in a structural formula (II) and a pigment C shown in a structural formula (III):

(II)

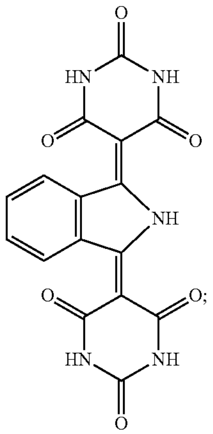

and (III)

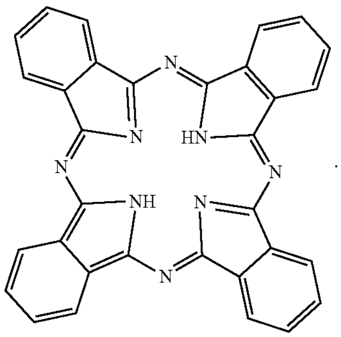

.

11. The electronic device according to claim 10, wherein by mass fraction, the color material comprises:

5-20% of the pigment A by mass fraction;

10-35% of the pigment B by mass fraction; and 20-65% of the pigment C by mass fraction.

12. The electronic device according to claim 10, wherein the color material further comprises a pigment D shown in a structural formula (IV):

(IV)

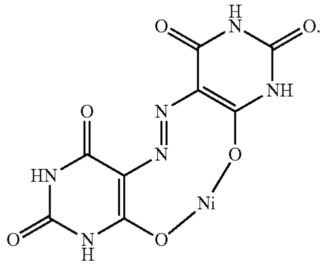

.

13. The electronic device according to claim 12, wherein a mass fraction of the pigment D is greater than a mass fraction of the pigment B in the color material.

14. The electronic device according to claim 13, wherein by mass fraction, the color material comprises:

15-25% of the pigment A by mass fraction;

0-10% of the pigment B by mass fraction;

15-40% of the pigment C by mass fraction; and 20-50% of the pigment D by mass fraction.

15. The electronic device according to claim 14, wherein the mass fraction of the pigment D is greater than a mass fraction of the pigment A and a mass fraction of the pigment C.

16. The electronic device according to claim 10, wherein by mass fraction, the green photoresist comprises 0-30% of the color material by mass fraction.

17. The electronic device according to claim 10, wherein the green photoresist further comprises a solvent, and a material of the solvent comprises at least one of propylene glycol methyl ether acetate, propylene glycol monomethyl ether, or diacetone alcohol.

18. The electronic device according to claim 10, wherein the green photoresist further comprises a reactive monomer, and a material of the reactive monomer comprises at least one of methyl methacrylate, acrylic acid, methacrylic acid or glycidyl methacrylate.

* * * * *